(12) United States Patent
Le et al.

(10) Patent No.: US 6,425,077 B1
(45) Date of Patent: Jul. 23, 2002

(54) SYSTEM AND METHOD FOR READING DATA FROM A PROGRAMMABLE LOGIC DEVICE

(75) Inventors: Thach-Kinh Le, Monte Sereno; Chakravarthy K. Allamsetty, Milpitas; Carl H. Carmichael, Campbell; Arun K. Mandhania, Milpitas, all of CA (US); Donald H. St. Pierre, Jr., Nashua, NH (US); Conrad A. Theron, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/312,024

(22) Filed: May 14, 1999

(51) Int. Cl.[7] .................................................. G06F 3/00
(52) U.S. Cl. ................................. 713/1; 710/8; 713/600
(58) Field of Search .......................... 713/1, 600; 710/1, 710/8, 10, 58; 326/37–50

(56) References Cited

U.S. PATENT DOCUMENTS 5,033,017 A * 7/1991 Taniai et al. ................. 708/232
5,214,327 A * 5/1993 Saeki et al. ................... 326/28
6,212,639 B1 * 4/2001 Erickson et al. ............. 713/200
6,288,970 B1 * 9/2001 Reddy et al. ............ 365/230.05

OTHER PUBLICATIONS

The Programmable Logic Data Book, published 1998 by Xilinx, Inc.

\* cited by examiner

Primary Examiner—Thomas M. Heckler
(74) Attorney, Agent, or Firm—Edel M. Young; LeRoy D. Maunu

(57) ABSTRACT

A system and method for reading back data from a programmable logic device (PLD). A clock offset table having one or more clock offset values is constructed. Each clock offset value indicates a relative clock cycle at which a selected bit read from the device is saved and sent to a host computer. The data is read from the PLD at a rate of one bit per readback clock cycle, and the readback clock cycles are counted as the bits are read from the device. When the count of readback clock cycles equals an offset, the bit is selected and saved.

24 Claims, 5 Drawing Sheets

SYSTEM AND METHOD FOR READING DATA FROM A PROGRAMMABLE LOGIC DEVICE

FIELD OF THE INVENTION

The present invention generally relates to reading data from programmable logic devices, and more particularly to selecting a subset of data from a large block of data read from a PLD.

BACKGROUND

Field programmable gate arrays (FPGAs), first introduced by XILINX in 1985, are becoming increasingly popular devices for use in electronics systems. For example, communications systems frequently employ FPGAs for their re-programmability. In general, the use of FPGAs continues to grow at a rapid rate because FPGAs permit relatively short design cycles, reduce costs through logic consolidation, and offer flexibility through re-programmability. The capabilities of and specifications for XILINX FPGAs are set forth in "The Programmable Logic Data Book," published in 1998 by XILINX, Inc., the contents of which is incorporated herein by reference.

Where once a typical FPGA design comprised perhaps 5,000 gates, FPGA designs with 50,000 gates are now common, and FPGAs supporting 300,000 to 1,000,000 gates are available. New challenges for testing and debugging designs implemented on the devices have accompanied the growth in PLDs, particularly FPGAs. For example, large configuration bitstreams must be manipulated to test the PLDs. Thus, additional off-PLD storage and increased programming time are undesirable side effects of the growing size of configuration bitstreams.

In a test sequence that is presently used for designs implemented on PLDs, the configuration bitstream is downloaded to the device, selected input signals are provided to the device while advancing the device clock at selected times, and the state of the device is read back after having advanced the clock and provided the input signals. The state data can then be compared to expected state data to verify proper operation of the design.

In some PLDs, the data read back from the PLD correspond by position to the configuration bitstream downloaded to the PLD. In other PLDs, the configuration bitstream includes commands to replicate portions of the bitstream, so the data read back from the PLD includes more bits than the original bitstream. In either case, bits in the configuration bitstream that were used to program resources such as lookup tables, multiplexers, and signal line connections, and to initialize storage elements such as flip-flops, correspond to data read back from the PLD. The bitstream read back from a PLD includes two kinds of data: (1) the configuration data for determining the configuration of the PLD, which can be verified immediately after the configuration has been loaded into the PLD, and (2) state information stored in the storage elements in the PLD. The states of storage elements will probably change while running the test even though the states of bits used to program the programmable resources will probably remain the same. Thus it may be desirable to repeatedly monitor states of some of the storage elements but not to monitor the configuration data.

Communication between a host computer and a PLD typically occurs through an interface cable that includes electronic devices. For example, the XChecker™ cable available from Xilinx, Inc. includes an FPGA situated in the interface cable. This XChecker interface cable can perform several functions: transfer data from a host computer to the destination PLD for configuring the PLD, verify that data has been properly transferred, and read back selected data from the PLD, store it, and transfer it to the host computer (a function useful for debugging).

To select the desired data from the data read back from the device, past practice included creating a mask file indicating which bits of the data comprise the desired data. Thus, in the XChecker interface cable is a memory sufficient for holding the mask file. The size of the mask file is at least as large as the size of the configuration bitstream. Thus, prior systems had to process and provide storage for a large mask file, which can be larger than 1 MB. As PLD devices become larger, the size of this memory must be increased. Further, the time required to load the mask file from a host computer into the memory of the interface cable is greater for larger devices.

The continued growth in number of programmable resources and storage elements in PLDs will require more storage for the data being read back from the PLD, and merely providing increased storage for the larger data file increases system costs. Furthermore, if the data file must be transferred via a serial bitstream to an interface device, the process could be very time consuming. Thus, a method that reduces both required memory and time for transferring data, as well as other related problems, is desirable.

The continued growth in number of programmable resources and storage elements in PLDs will require more storage for the mask file, and merely providing increased storage for the larger mask file increases system costs. Furthermore, if the mask file must be transferred via a serial interface (to an interface device, for example), the process could be very time consuming. Thus, a method that address the aforementioned problems, as well as other related problems, is desirable.

SUMMARY OF THE INVENTION

The invention provides a system and method for reading back data from a large programmable logic device (PLD). With the system and method of the invention, the size of memory required to store selected bits can be smaller, indeed much smaller, than the number of bits stored in the PLD. Further, the speed of communicating the smaller amount of selected information from the PLD to the host computer is typically much faster than in the prior art because an interface device is provided having a high communication rate to the PLD, so that only a small amount of information is communicated at the slower rate between the interface device and the host computer.

In one embodiment, a clock offset table having one or more clock offset values is constructed. Each clock offset value indicates a relative readback clock cycle at which a selected bit is read from the PLD. The data is read from the PLD at a rate of one bit per readback clock cycle, and the readback clock cycles are counted as the bits are read from the device. When the count of readback clock cycles equals an offset value, the bit is saved by the interface device. Other bits are not saved by the interface device.

In another embodiment, data is read from the PLD at a rate of eight bits per readback clock cycle. In this embodiment, offset values are specified in units of bytes rather than bits. At each readback clock cycle, data can of course be read back in words having any length expected by the host, and the offsets are specified in units of words.

In another embodiment, data to be read from the PLD are specified by specifying a combination of offset values and ranges of adjacent bits. All data bits are read from the PLD, unwanted bits are discarded, and the data bits corresponding to the respective offset values are selected.

A system for reading data from a PLD comprises a host data processing system, a memory, an FPGA, and a microcontroller. The host is arranged to generate a configuration bitstream and a clock offset table, the clock offset table having one or more clock offset values representing respective readback clock cycle offsets corresponding to bits to be selected from data read from the PLD. The microcontroller and FPGA are coupled to the host, the memory, and the PLD. The microcontroller is programmed to download the configuration bitstream from the host to the PLD, and store the clock offset table in the memory. The FPGA in response to a command from the microprocessor toggles the PLD to send bits of data at a rate of one bit, byte, or word per readback clock cycle, and selects bits bytes, or words based on the clock offset values. The host then retrieves the selected bits bytes, or words.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
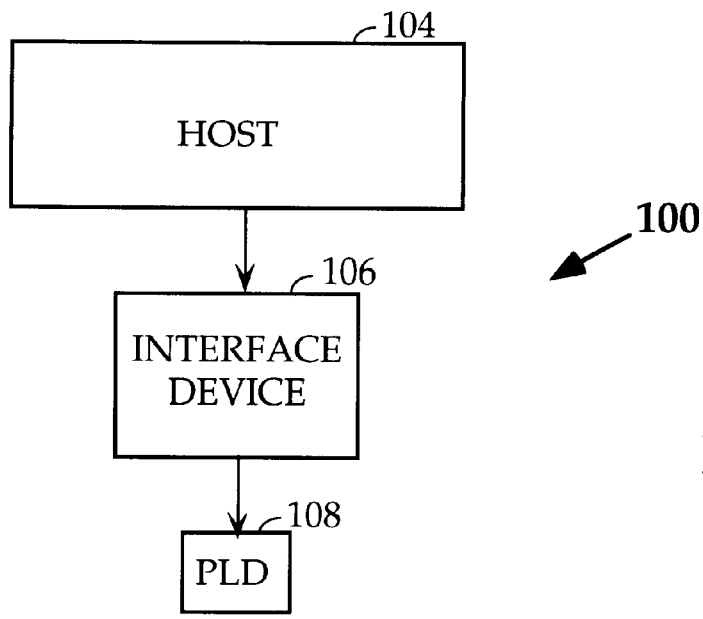
FIG. 1 is a diagram of an example system for configuring a PLD.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intent is to cover all modifications, equivalents, and alternatives falling within the spirit and scope of the invention as defined by the appended claims.

DETAILED DESCRIPTION

The present invention is believed to be applicable to a variety of methods and systems for reading data from PLDs. The present invention has been found to be particularly applicable and beneficial for sequentially reading data from FPGAs. While the present invention is not so limited, an appreciation of the present invention is presented by way of specific examples involving FPGAs.

FIG. 1 is a block diagram of an example system 100 for configuring and testing a programmable logic device (PLD) 108. System 100 includes host data processing system 104, interface device, and 106 PLD 108. In the example embodiment, host 104 is a conventional workstation or personal computer that is configured to execute hardware debugging software. Host 104 is coupled to interface device 106 via a USB or RS232 interface. The MultiLINX™ cable product from XILINX can be configured in accordance with the present invention and provides the functions of interface device 106. PLD 108 is coupled to interface device 106 via conventional wiring.

According to an example process, a circuit design embodied in a configuration bitstream is downloaded to PLD 108. The configuration bitstream can be constructed using conventional electronic design tools. A user can then select, via hardware debugging software executing on host 104, which signals of the circuit design are to be examined or "probed." The signals correspond to states of storage elements, for example flip-flops, in PLD 108.

To reduce storage requirements for specifying which bits of PLD 108 are to be read, offsets between the desired bits may be stored in a table, and downloaded to interface device 106. Instead of storing a mask file, which is comparable in size to the configuration bitstream, the offsets are stored. Storing offsets instead of the mask file also reduces the time required to download the information to interface device 106. The user can then commence testing the design on PLD 108 by advancing the chip clock of PLD 108 and supplying desired input signals.

After advancing the chip clock a desired number of cycles and supplying the desired input signals, the user can probe the desired signals by reading back data from PLD 108. The "readback data" is comprised of the configuration bits used to program the programmable resources, such as lookup tables and multiplexers, along with bits from storage elements in the device. The states of the storage elements may have changed from the initial states specified in the configuration bitstream, while configuration bits remain unchanged.

Interface device 106 reads the data from PLD 108. In the example embodiment, the data is clocked by a readback clock signal, wherein one bit of data is read per cycle of the readback clock signal. Thus, interface device 106 counts cycles of the readback clock signal and compares the count to the offsets to select the desired bits.

Figure 2:
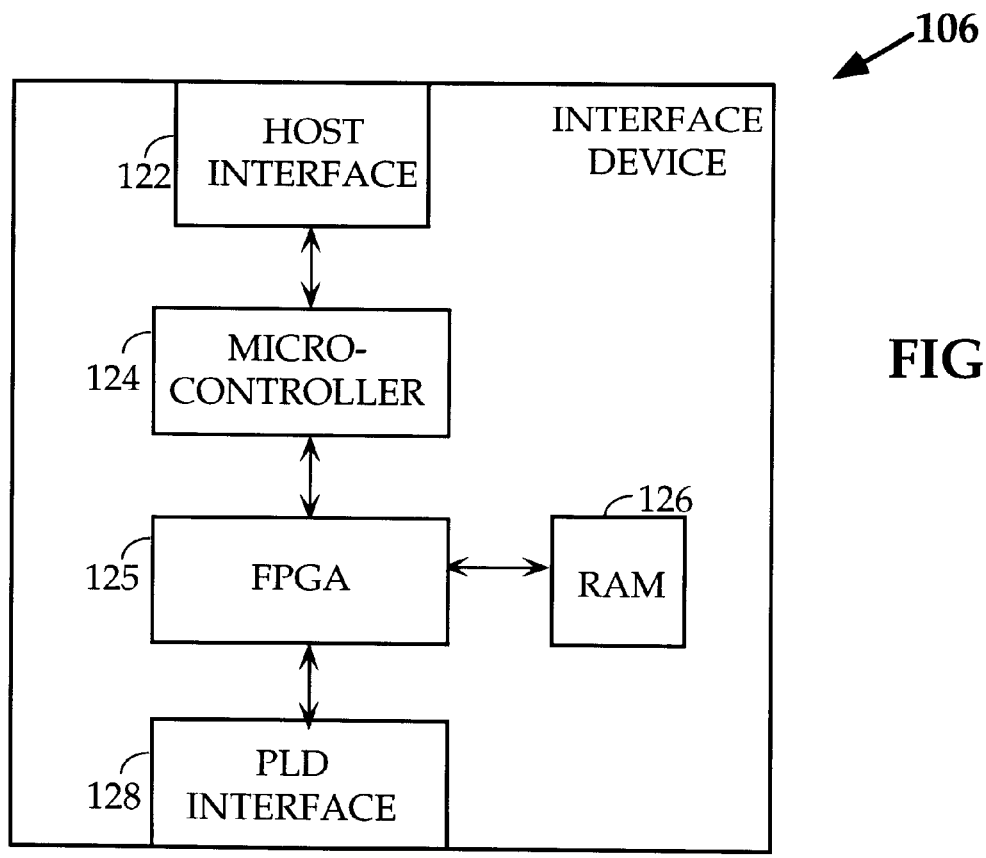
FIG. 2 is a block diagram of an example interface device.

FIG. 2 is a block diagram of an example interface device 106. Interface device 106 includes host interface section 122, microcontroller 124, FPGA 125, RAM 126, and PLD interface 128. FPGA 125 directs operations of interface device 106 in response to control signals issued from host 104 and passed on by microcontroller 124. For example, in response to a user instructing hardware debugger software on host 104 to advance the chip clock for PLD 108, microcontroller 124 advances the chip clock to PLD 108 by one cycle.

RAM 126 is coupled to FPGA 125. A portion of the configuration bitstream downloaded from host 104 is temporarily stored by FPGA 125 into a FIFO in RAM 126, which is used as a temporary buffer while downloading the configuration bitstream via PLD interface 128 to PLD 108.

PLD interface 128 is coupled to FPGA 125. The particular attributes of PLD interface 128 depend on the particular PLD 108. Host interface 122 is also coupled to microcontroller 124 and can be coupled via a USB interface or an RS232 interface.

The elements of interface device 106 can be conventional devices connected and arranged in a conventional manner. Those skilled in the art will appreciated that various alternative embodiments would be suitable to implement the present invention.

Figure 3:
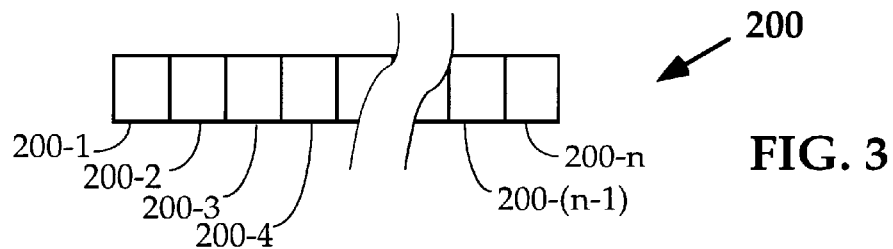
FIG. 3 illustrates a set of clock offsets.

FIG. 3 illustrates a set of clock offsets 200. The example offsets 200 include offsets designated as 200-1, 200-2, 200-3, . . . , 200-n. In one embodiment, there: is a respective offset value for each of the signal states to read from the device. The value of offset 200-1 indicates the number of readback clock cycles, relative to initiation of the readback clock, that occur before the state of the first selected signal is read from the device; the value of offset 200-2 indicates the number of readback clock cycles, relative to offset 200-1, that occur before the state of the second selected signal is read from the device; . . . and the value of offset 200-n indicates the number of readback clock cycles, relative to the offset 200-(n−1), that occur before the state of the $n^{th}$ selected signal is read from the device. If, for example, offsets 200-1, 200-2, and 200-3 have the values 65, 554, and 2078, respectively, the bit for the first selected signal will appear on cycle 65 of the readback clock; the bit for the second selected signal will appear 554 cycles following the first selected signal (or 65+554 cycles from initiation of reading back); and the bit for the third selected signal will appear 2078 cycles following the second selected signal (or 65 +554+2078 cycles from initiation).

In an alternative embodiment, the clock offset values can be relative to the $0^{th}$ readback cycle rather than relative to one another.

In another alternative embodiment, an adjacent set of bits to be read are specified by specifying a clock offset value for a first bit and specifying a range of adjacent bits to be read.

Clock offsets 200 are compiled by software executing on host 104 in response to a user's selection of signals to probe. Once offsets 200 are assembled, they are downloaded to interface device 106. It will be appreciated that a user may select signals in an order that is different from the order in which bits representing states of the signals are read from the device. That is, the user may select signal y and then select signal x even though signal x may be read from the device prior to reading signal y. Thus, for the selected signals, host software arranges offsets 200 in the order in which the bits representing the selected signals are read.

In an example embodiment, two bytes are generally used to store each of the offsets, which effectively places a limit of 65,535 ($FFFF_{16}$) as the maximum offset that can be specified. It will be appreciated, however, that the offset between a pair of selected signals may exceed this maximum. The present invention addresses this situation, for example, by using multiple pairs of bytes. For example if the desired offset is 65,536, two pairs of two bytes are used: $FFFF_{16}$ and $0001_{16}$, which is interpreted as: 65,535+1=65, 536. The end of a sequence of pairs of bytes is designated with a value less than 65,535. For example, a clock offset can be specified with the following sequence of pairs of bytes: $FFFF_{16}$ $FFFF_{16}$ $FFFF_{16}$ $10A7_{16}$, which is interpreted as 65,535+65,535+65,535 +4263=200,868.

If the desired clock offset is evenly divisible by 65,535, then the pairs of bytes are terminated by 0. For example, if the desired clock value is 65,535, then the following sequence of two pairs of bytes is used: $FFFF_{16}$ $0000_{16}$. In another example, if the desired clock offset value is 524,280 (=65,535*8), then the following sequence of 9 pairs of bytes is used: $FFFF_{16}$ $FFFF_{16}$ $FFFF_{16}$ $FFFF_{16}$ $FFFF_{16}$ $FFFF_{16}$ $FFFF_{16}$ $FFFF_{16}$ $0000_{16}$. The sequence $FFFF_{16}$ advances the clock 65,535 cycles but doesn't store the bit that is read back at that location.

Figure 4:
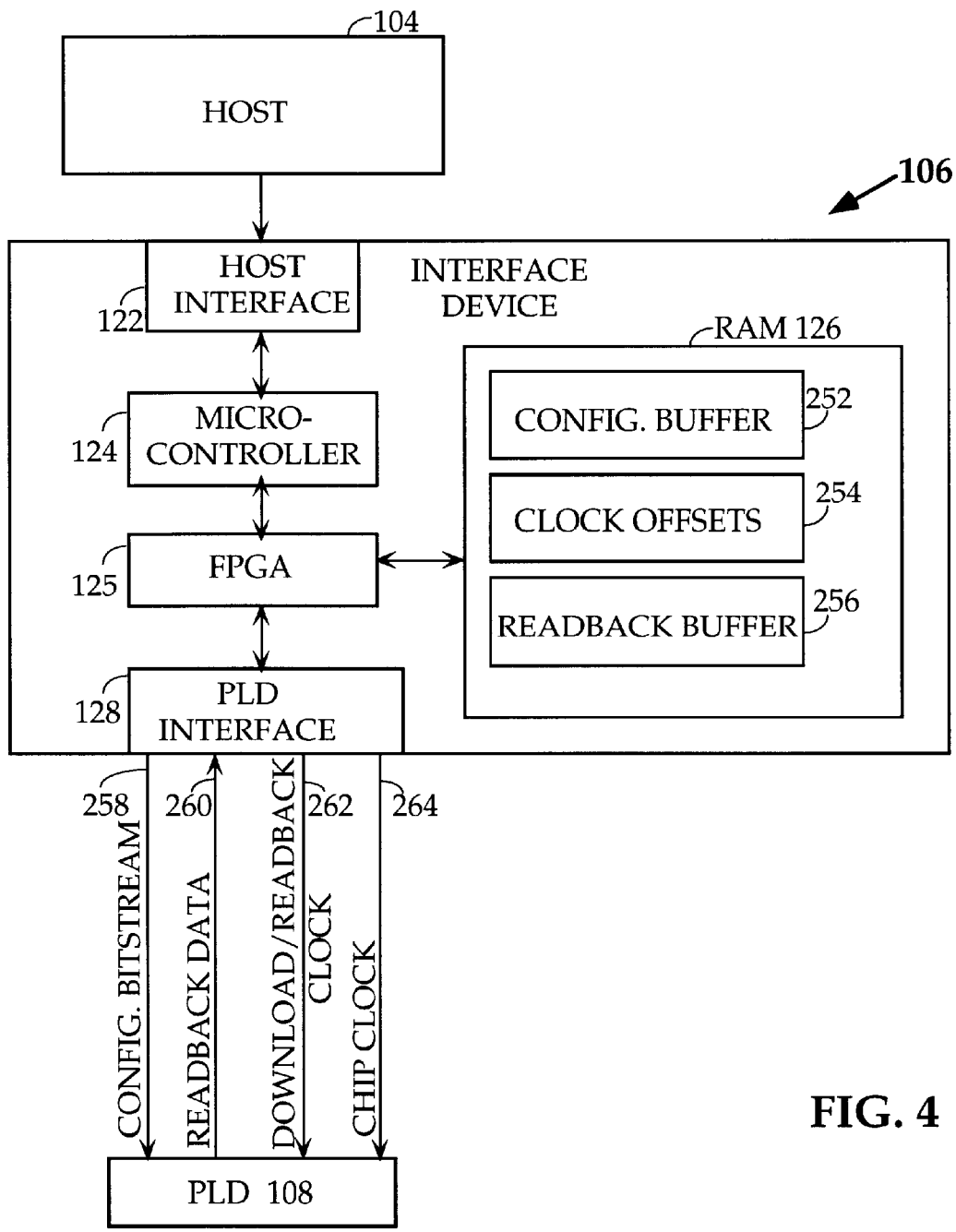
FIG. 4 is a functional block diagram of a system for configuring a PLD.

FIG. 4 is a functional block diagram of a system 250 for configuring a PLD 108 and reading back data. Memory element 126 of interface device 106 includes storage areas for configuration buffer 252, clock offsets 254, and readback buffer 256. PLD 108 is coupled to interface device 106 via data input line 258, data output line 260, download/readback clock line 262, and chip clock line 264.

A configuration bitstream is generated on host 104 and downloaded to interface 106 under control of microcontroller 124 (FIG. 2) and FPGA 125 in response to user controls issued from host 104. The configuration bitstream is temporarily stored in configuration buffer 252 prior to being downloaded to PLD 108. Microcontroller 124, FPGA 125, and PLD interface 128 (FIG. 2), download the configuration bitstream from buffer 252 to PLD 108 via bitstream input line 258. In an example embodiment, PLD interface 128 can be implemented with one or more FPGAs. A download clock signal is generated from within interface device 106 and provided as an input download clock signal on line 262 to PLD 108. In an example embodiment, one bit of the configuration bitstream is downloaded per cycle of the download clock.

Signals to be probed are selected by a user via software on host 104. The host software assembles the clock offsets in order to select from data read from PLD 108 the data bits associated with the selected signals. The clock offsets can be determined based on a known order in which the data are read from PLD 108, and based on the fact that in the example embodiment, data bits are read from PLD 108 at a rate of one bit per readback clock cycle. Once all the desired signals to probe have been selected and the clock offsets have been assembled, the clock offsets are downloaded to area 254 of RAM 126 in interface device 106.

The circuit implemented on PLD 108 is tested under control of software on host 104. The host software controls, under direction from a user, advancing the chip clock signal on line 264. The chip clock signal is used as the main timing signal for the circuit implemented on PLD 108, for example. While not shown, it will be appreciated that test vectors could be input to PLD 108 by other circuitry that is external to PLD 108.

When the user's desired test sequence is complete, data is read back from PLD 108 via readback data output line 260. Initiating the readback of data from PLD 108 is controlled, for example, by a user interacting with software on host 104. Host 104 signals interface device 106 to start reading back data from PLD 108, and microcontroller 124 (FIG. 2) initiates the readback clock signal on line 262 to PLD 108. The data is read from PLD 108 at a rate of one bit per cycle of the readback clock signal and selectively stored in readback buffer 256.

The selections of the particular data that is stored in readback buffer 256 are made based upon the clock offsets specified in area 254 of RAM 126. The offsets are read and the cycles of the readback clock signal are counted to determine when the bit for the selected signal is being output.

With the system and method of the invention, the size of RAM 126 required to store selected bits can be smaller, indeed much smaller, than the number of bits stored in PLD 108. Further, the speed of communicating the smaller amount of selected information from interface device 106 to host computer 104 is typically much faster than in the prior art because the communication rate between PLD interface 128 of interface device 106 and PLD 108 is typically higher than that between host interface 122 of interface device 106 and host computer 104.

Figure 5:
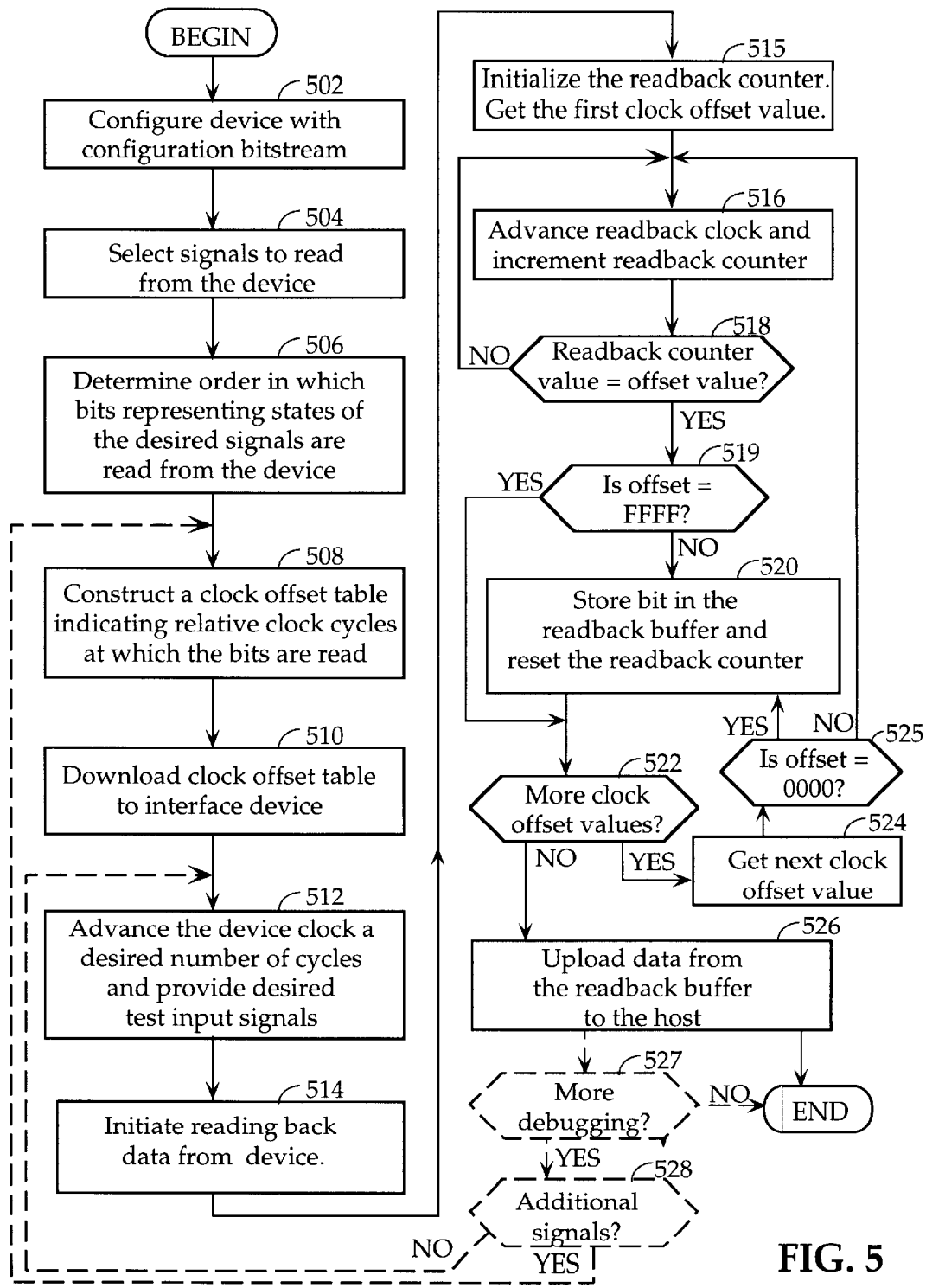
FIG 5 is a flowchart of an example method for reading data from a PLD.

FIG. 5 is a flowchart of an example method for reading data from a PLD. The process generally comprises configuring the device with a configuration bitstream. Signals to be probed are selected, and clock offsets are assembled based on the selected signals and the order in which bits representing the states of the respective signals are read from the device. When a desired test sequence is complete, data is read from the device, and the clock offsets are used to select the desired bits from all the bits read from the device.

At step 502, the device is configured with a configuration bitstream using conventional hardware and software. At step 504, the signals to probe are selected. In various embodiments, the signals can be selected using various graphical user interface techniques or a command driven interface.

The order in which data are read from the device is known. Thus, as shown by step 506, the order in which the bits representing states of the selected signals are read from the device is determined. In addition, since in the example embodiment the bits are read from the device at a rate of one bit per readback clock cycle, the relative clock offsets between the selected bits can be determined. At step 508, a clock offset table is constructed. At step 510, the clock offset table is downloaded to interface device 106.

The desired test sequence is performed starting at step 510. First, at step 510, host 104 downloads a clock offset table to interface device 106. At step 512, the chip clock is advanced a selected number of cycles and, optionally, selected data input signals are provided to the device at selected times in accordance with the desired test.

At step 514, readback of the data is initiated. At step 515 the process begins by initializing a readback counter and reading the first clock offset value. As explained above, clock offset values that are greater than 65,535 are stored in a sequence of pairs of bytes. Thus, multiple pairs of bytes may need to be read to get the clock offset value.

At step. 516, the readback clock signal is advanced one cycle, and the readback counter is incremented. At step 518, if the readback counter value is not equal to the offset value, then the bit appearing on the readback data line (e.g., 260, FIG. 4) is not one of the selected bits, and decision step 518 directs the process to step 516 to advance the readback clock and read the next bit. This process continues until the counter value equals the offset value, at which time control moves to step 519.

At step 519, the offset value is tested. If the offset value is FFFF, the desired offset is larger than 65,535, so no bit should be stored for the FFFF offset value, and step 519 advances control to step 522. If the offset value is not FFFF, control moves to step 520.

At step 520, the selected bit is stored in readback buffer 256, for example, and the readback counter is reset to 0. For as long as there are more clock offset values to process, decision step 522 directs the process to step 524 to get the next clock offset value. If the offset value happens to be 0000, the clock does not need to be advanced, so step 525 directs control to step 520, and the bit is stored. If the offset is not 0000, step 525 returns control to step 516.

After all clock offset values have been processed, at step 526, the data accumulated in the readback buffer is uploaded to host 104. The states of the selected signals can be displayed in a waveform view or a textual report, and also compared to expected data to determined whether the circuit behaved as expected.

In one embodiment also illustrated in FIG. 5, selection of additional or different signals to probe and construction of a different clock offset table can be performed after completion of a first test sequence. Optional steps 527 and 528 test for whether more debugging is to be performed. In this embodiment, if step 527 indicates no more debugging is to be performed, the process ends. If more debugging is to be performed, step 528 test whether additional signals are to be probed. If so, control returns to step 508 where a new clock offset table is constructed and at step 510 downloaded to the interface device. If no additional signals are to be probed, no new clock offset table is needed, and control returns to step 512 where the clock is advanced a desired number of cycles and the remainder of the process is repeated.

Figure 6:
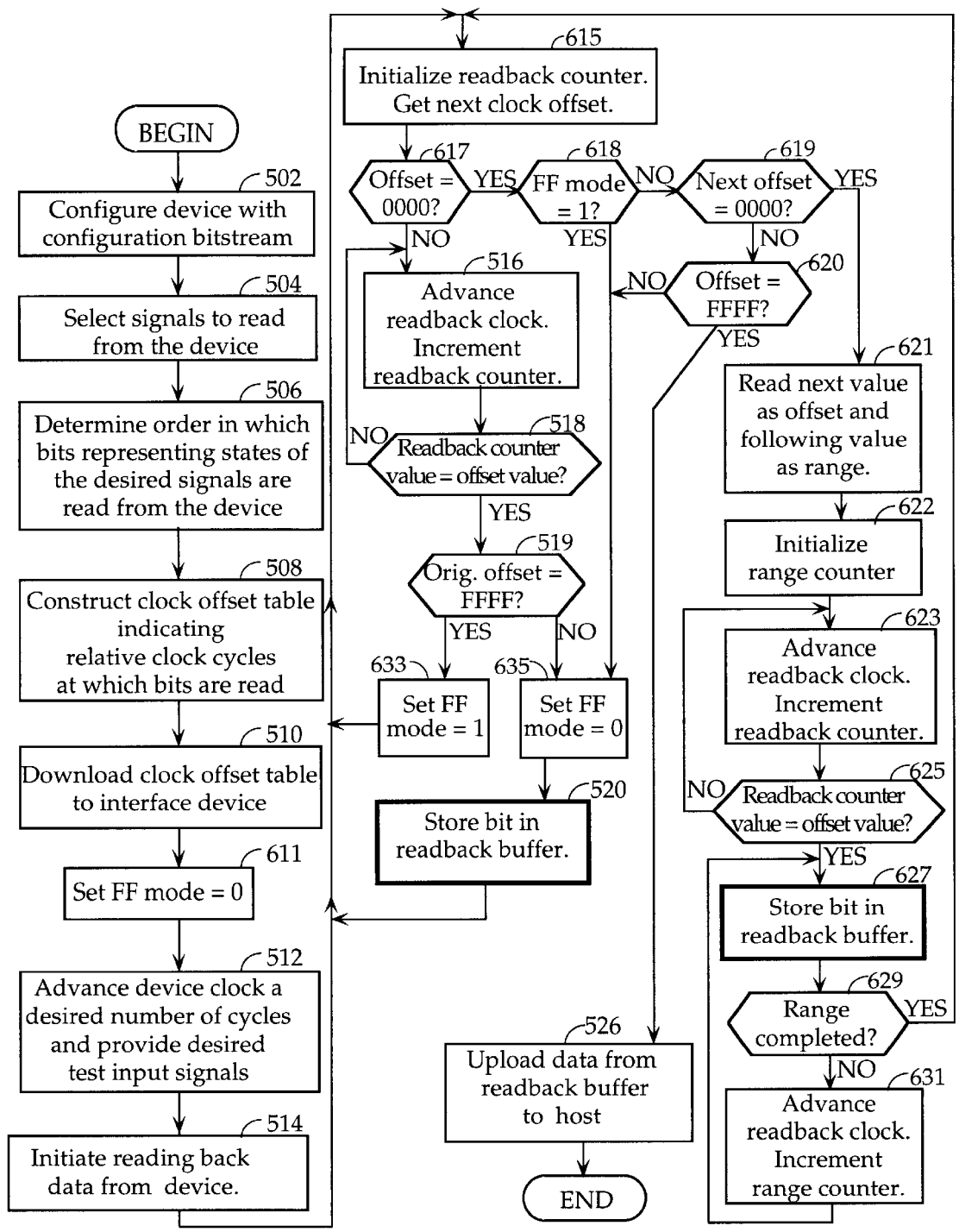
FIG 6 is a flowchart of another example method for reading data from a PLD.

FIG. 6 shows another flow chart for reading back data from a PLD. In this embodiment, the user can specify not only an offset value but a range of adjacent bits to be captured. Such a feature is desirable when, for example, the user may want to know the contents of a 16-bit lookup table, or may want a complete readout on a section of the PLD. This embodiment uses two adjacent values of 0000 to indicate that the values to follow are an offset followed by a range, and uses 0000 followed by FFFF to indicate the end of the offset value file.

Steps 502 through 514 are the same as shown and discussed in FIG. 5 except that a new step 611 has been added between steps 510 and 512 to set an FF mode flag to indicate whether the process is or is not in a mode that follows receiving an offset of FFFF (indicates a large offset). Similar to step 515, in step 615, the readback counter is loaded or initialized. It is equally plausible to initialize the readback counter to 0 and increment until the readback counter value equals the offset, or to load the offset value into the counter and decrement the counter until the counter reaches 0. The embodiment of FIG. 6 assumes the readback counter will be decremented. Therefore, unlike FIG. 5, the process gets the next clock offset value before the readback counter is loaded with this value.

At step 617, a test determines whether the offset value is 0000. If not, the process continues at steps 516, 518, and 519 as described above for FIG. 5. After step 519 the FF mode flag may be set. If the offset value is FFFF, the process moves to step 633 and the FF mode flag is set to 1, indicating the offset is large and the identified bit is not to be stored. However, if step 519 indicates the offset value is not FFFF, the process moves to step 635, where the FF mode flag is set to 0 (meaning the offset is not larger than FFFE), and at step 520 the bit is stored. In either case, the process then returns to step 615, where the readback counter is again initialized and the process gets the next offset.

If step 617 indicates the offset value is 0000, the range option may have been specified. Step 618 checks to see if the process is in FF mode. If so, a 0000 has followed an FFFF and the bit is to be stored. So step 635 resets the FF mode flag to 0 and step 520 stores the bit. If step 618 indicates the process is not in FF mode, the process moves to step 619 where the next offset value is checked. At this point a second 0000 indicates a range is specified and the process moves to step 621 where the next two values are read as an offset and a range. At step 622, a range counter is initialized with the range value. Then steps 623 and 625 look for the first matching offset. When found, the process moves to step 627 and the first bit of the range is stored. Then steps 629 and 631 and 627 move through the range storing successive values until step 629 indicates the range is completed.

If step 620 indicates the offset is FFFF (but recall that step 620 is reached when the process is not in FF mode), then the sequence was 0000 followed by FFFF, and the end of the offset file is indicated. Thus the process moves to step 526 where data are uploaded to the host.

Figure 7:
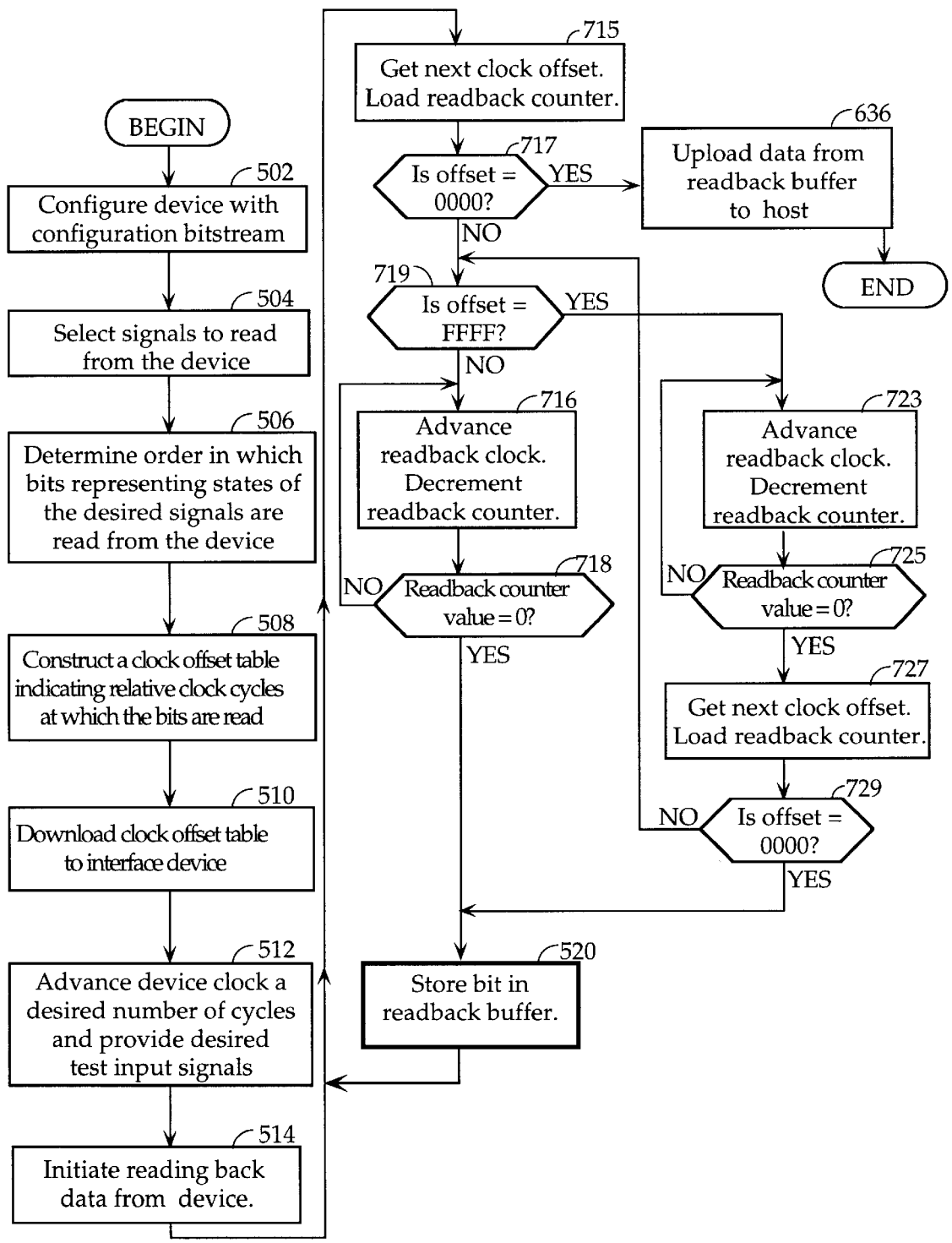
FIG. 7 is a flowchart of yet another example method for reading data from a PLD.

FIG. 7 shows yet another embodiment in which an offset value of FFFF followed by 0000 indicates a bit to be stored, and any other offset value followed by 0000 indicates the end of the offset value file. Steps 502 through 514 are as described above for FIG. 6. Steps 715 and 716 differ from steps 615 and 616 because the embodiment loads the initial offset value into the readback counter and decrements rather than increments the readback counter.

Additionally, in step 717, if the offset is 0000, the end of file is indicated and the process moves to step 636, where data are uploaded to the host. If the test for offset 0000 at step 717 indicates a non-zero offset, more bits are to be collected and stored. The process moves to step 719 where a test is made for the offset value FFFF. Then, as before, if the value is not FFFF, step 716 advances the readback clock and decrements the readback counter until at step 718 a match is found, and at step 520 the bit is stored in the readback buffer. However, if the value found at step 719 is FFFF, step 719 moves the process to steps 723 and 725 where a match is found but not stored. Instead, at steps 727 and 729, action similar to but not identical to steps 715 and 717 occurs. As before, at steps 727 and 729, the next clock offset is loaded and examined. Now, at step 729, a different sequence occurs. If that next offset is 0000, meaning 0000 has followed FFFF, the process moves to step 520 where the bit is stored. If not 0000, control is returned to step 719 where if the offset value is not FFFF, control moves to steps 716 and 718 where the next match is found, and at step 520 a bit stored.

When all the bits to be retrieved have been collected, the offset file will present a value of 0000, which will cause step 617 to move the process to step 636, and the bits are sent to the host.

The host may again cause interface device 106 to toggle the chip clock a selected number of times and repeat the readback process. If it is again desired to observe the same set of signals, it is not necessary to again download offsets from the host to the interface device, since RAM 126 still stores the previous offsets. Instead, the host simply needs to issue a readback command, and new values will be read from the target PLD and stored in the readback buffer. The host can then upload and display the contents of that buffer.

Another embodiment allows a user to indicate a repeating offset value without having to state the offset value repeatedly. Such an embodiment is useful when a PLD architecture uses a bitstream with a repeating pattern such as, for example, locating a particular flip flop of successive logic blocks at every 250th bit, and the user wishes to read the flip flop values for all logic blocks, but no other values. Similar to the embodiment described above in connection with FIG. 6, a particular sequence of values can indicate that following values will specify a first offset followed by the spacing of repeated offsets. This embodiment can also be combined with the range embodiment (FIG. 6) to provide both range and repeating offset.

Accordingly, the present invention provides, among other aspects, a system and method for reading data from a PLD. Other aspects and embodiments of the present invention will be apparent to those skilled in the art from the specification disclosed herein. For example, if a designer has provided a very small device, the offset could be described with a single byte (two hex digits). Or for a very large device, more digits may be used. And of course, there is nothing to require use of the 0000 value to indicate end of file, to use FFFF to indicate a larger offset, or to use two 0000 values to indicate a range. Other values could instead be selected. And, as discussed briefly above, even though the description refers primarily to reading back one bit on each readback clock cycle, it is possible to read back any expected number of bits, such as a byte or a word. It is intended that the specification and illustrated embodiments be considered as examples only, with a true scope and spirit of the invention being indicated by the following claims.

What is claimed is:

1. A method for reading data from a programmable logic device (PLD), comprising:
   downloading a configuration bitstream to the PLD;
   specifying data to be read from the PLD by specifying an offset value for at least one bit of data to be read;
   reading data from the PLD; and
   selecting, from the data read from the PLD, data corresponding to the respective offset values.

2. The method of claim 1, wherein the offset values are specified from a previous readback clock cycle at which a data bit was read.

3. The method of claim 1, wherein the offset values are specified starting from a first readback clock cycle relative to initiation of a readback clock signal, and further comprising:
   sequentially reading bits of data from the PLD at a rate of one bit per readback clock cycle; and
   counting the readback clock cycles while reading the bits.

4. The method of claim 1, wherein the offset values are specified starting from a first readback clock cycle relative to initiation of a readback clock signal, and further comprising:
   sequentially reading bytes of data from the PLD at a rate of one byte per readback clock cycle; and
   counting the readback clock cycles while reading the bytes.

5. The method of claim 1, wherein some of the offset values are specified by specifying a single offset value followed by a range of offset values.

6. The method of claim 1, further comprising constructing a clock-offset table in a memory, the clock-offset table having a plurality of values indicating readback clock cycles at which selected bits are read from the PLD.

7. The method of claim 6, further comprising:
   downloading the clock-offset table to an interface device before reading data from the PLD; and
   selecting the data corresponding to the clock offset values at the interface device.

8. The method of claim 1, further comprising:
   providing a download/readback clock signal from an interface device to the PLD for controlling readback of data from the PLD, and a chip clock signal from the interface device to the PLD for controlling operation of the PLD; and
   advancing the chip clock signal by a selected number of cycles prior to reading data from the PLD.

9. The method of claim 8, further comprising providing selected input signals from a device other than the interface device to the PLD at selected times.

10. The method of claim 1, wherein the offset values are relative to one another and represent respective readback clock cycle offsets, and further comprising:
   constructing a clock-offset table in a memory, the clock-offset table having a plurality of off-set values indicating readback clock cycles at which selected bits are read from the PLD, wherein numbers of bytes required for storage of the respective values are variable relative to magnitudes of the values;

sequentially reading bits of data from the PLD at a rate of one bit per readback clock cycle; and counting the readback clock cycles while reading the bits.

11. The method of claim 1, further comprising externally providing input test signals to the PLD.

12. A system for reading data from a programmable logic device (PLD), comprising:

a host data processing system configured and arranged to generate a configuration bitstream and a clock-offset table, the clock-offset table having one or more offset values representing respective clock cycle offsets corresponding to bits to be selected from data read from the PLD;

a memory; and a logic device coupled to the host, the memory, and the PLD, configured and arranged to download the configuration bitstream from the host to the PLD, store the clock-offset table in the memory, and read bits of data from the PLD at a rate of one bit per readback clock cycle, and select bits based on the offset values.

13. The system of claim 12, wherein the logic device is a microcontroller.

14. The system of claim 12, wherein the logic device is a field programmable gate array.

15. The system of claim 12, wherein the offset values are relative one to another.

16. The system of claim 12, wherein the microcontroller is further coupled to the PLD via a readback clock signal line, and is further configured and arranged to advance the readback clock signal by a selected number of cycles.

17. The system of claim 16, wherein the microcontroller is further coupled to the host via a port, and the host sends control signals via the port, the microcontroller providing data to the host at a rate of one bit per cycle of the control signal.

18. An apparatus for reading data from a programmable logic device (PLD), comprising:

means for downloading a configuration bitstream to the PLD;

means for specifying data to read from the PLD with respective offset values;

means for reading data from the PLD; and means for selecting from the data read from the PLD, data corresponding to the respective offsets.

19. A method for reading back data from a programmable logic device (PLD), comprising:

constructing a clock offset table having one or more clock offset values, each value indicating a relative readback clock cycle at which a selected bit is read from the PLD;

reading data from the PLD at a rate of one bit per readback clock cycle; and counting readback clock cycles as bits are read from the PLD; and selecting a bit when a number of counted readback clock cycles corresponds to a clock offset value.

20. The method of claim 19, wherein the offset values are relative to one another.

21. The method of claim 19, wherein a number of bytes used to represent a respective offset value varies with the magnitude of the offset value.

22. The method of claim 21, wherein a highest offset value is reserved for indicating that an additional offset value will follow in order to specify a larger offset.

23. The method of claim 19 wherein a specified combination of offset values indicates that a starting offset value and a range of adjacent offset values will follow.

24. The method of claim 19 wherein a specified combination of offset values indicates that a starting offset value and an repeating offset will follow.

* * * * *